(12) United States Patent
Chiozzi et al.

(10) Patent No.: US 6,812,715 B2
(45) Date of Patent: Nov. 2, 2004

(54) CIRCUIT AND METHOD FOR DETECTING LOAD IMPEDANCE

(75) Inventors: Giorgio Chiozzi, Cinisello Balsamo (IT); Sandro Storti, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/270,023

(22) Filed: Oct. 10, 2002

(65) Prior Publication Data

US 2003/0122549 A1 Jul. 3, 2003

Related U.S. Application Data

(63) Continuation of application No. 09/938,747, filed on Aug. 23, 2001, now abandoned, which is a continuation of application No. 09/760,006, filed on Jan. 11, 2001, now abandoned.

(30) Foreign Application Priority Data

Jan. 20, 2000 (EP) .......................................... 00830027

(51) Int. Cl.$^7$ ............................................. G01R 27/08
(52) U.S. Cl. ...................................... 324/691; 324/525
(58) Field of Search ................................ 324/500, 521, 324/525, 649, 691; 330/10; 323/273

(56) References Cited

U.S. PATENT DOCUMENTS

| | | | | |
|---|---|---|---|---|
| 3,912,981 A | * | 10/1975 | Tsurushima .................. | 361/98 |
| 5,311,138 A | * | 5/1994 | Ott et al. ..................... | 324/503 |
| 5,886,510 A | * | 3/1999 | Crespi et al. ................ | 323/273 |
| 6,229,389 B1 | * | 5/2001 | Pullen et al. ................. | 330/10 |
| 6,587,544 B2 | * | 7/2003 | Nössing et al. ........... | 379/26.01 |

FOREIGN PATENT DOCUMENTS

| | | |
|---|---|---|
| DE | 3221800 A1 | 12/1983 |
| EP | 0568198 A2 | 11/1993 |
| JP | 60254899 | 12/1985 |
| JP | 08136335 | 5/1996 |
| JP | 10327026 | 12/1998 |

* cited by examiner

*Primary Examiner*—Anjan Deb
*Assistant Examiner*—Walter Benson
(74) *Attorney, Agent, or Firm*—Lisa K. Jorgenson; E. Russell Tarleton; Seed IP Law Group PLLC

(57) ABSTRACT

A device for detecting load impedance having an analog circuit portion for detecting the impedance value of a load, and a digital circuit portion adapted to provide load impedance type information. The analog circuit portion having two power MOS transistors connected in series to each other and between a supply voltage and the ground, and a pair of mirror MOS transistors common-connected with their respective gate terminals to the gate terminals of the power MOS transistors. The digital circuit portion includes a first comparitor to determine whether the output current of an audio amplifier is higher or lower than a threshold value and a second comparator to determine whether the output voltage of the amplifier is higher than a threshold voltage, a memory to store output signals of the first and second comparitors, and a logic circuit arranged in cascade with the memory to output a load-type indication signal. The device further includes a third comparitor that enables outputting of the load-type indication signal when the output voltage of the audio amplifier crosses a zero threshold to thereby eliminate unwanted noise.

17 Claims, 2 Drawing Sheets

CIRCUIT AND METHOD FOR DETECTING LOAD IMPEDANCE

CROSS-REFERENCE TO RELATED APPLICATION

This application is a Continuation of U.S. patent application No. 09/938,747, filed Aug. 23, 2001, now abandoned, which application is incorporated herein by reference in its entirety.

TECHNICAL FIELD

The present invention relates to a circuit and a method for detecting load impedance.

BACKGROUND OF THE INVENTION

It is known that in some situations it is useful to detect whether the load impedance of an amplifier is higher or lower than a preset threshold value.

For example, audio amplifiers may need to drive different load impedances and therefore to modify parameters of the system according to the type of impedance of the applied load.

If different connectors for active loudspeakers and for passive loads are used, impedance detection with automatic gain adjustment would save a connector and would allow the user to insert the jack without looking for the correct output.

The simplest way to detect an impedance is to apply Ohm's law in steady-state conditions, measuring the voltage drop across the impedance while a known DC current is injected.

The main drawback of this solution is that the normal operation of the device must be interrupted in order to perform load impedance detection.

For example, detecting the impedance of the load of an audio amplifier can be performed during the power-on step; the drawback of this solution is the fact that if the impedance is switched during normal operations, detection cannot be performed.

In this case, periodic detections are not possible due to the clicking noise that would be generated.

Effective load impedance detection must be performed in real time, when a random signal is present at the output of the amplifier, so that switching of speakers from active to passive can be performed while the amplifier is operating.

Due to reactive components of the impedance which are always present in speakers (self-inductance of the coil and coupling capacitor), current phase offsets must be considered. In order to detect load impedance, known solutions use, as mentioned, Ohm's law in its general form, V=Z*I. This can be done by means of measurements of the RMS (Root Mean Square) type, by means of integrations performed on the waveform of the output current, or by comparing the output peak voltage with the peak current stored in the analog memory.

These solutions entail complex and accurate analog circuits and the use of a capacitor as an integrator or as an analog memory.

SUMMARY OF THE INVENTION

The disclosed embodiment of the present invention provides a device for detecting load impedance to enable impedance detection during the normal operation of the device, in real time.

More particularly, a circuit for detecting load impedance which is circuitally simpler than conventional circuits is provided.

In one embodiment, the circuit for detecting load impedance uses digital memory cells and can be fully integrated. The circuit for detecting load impedance is highly reliable, relatively easy to manufacture and at competitive costs.

The foregoing are achieved by a device for detecting load impedance that includes an analog circuit portion for detecting the impedance value of a load, and a digital circuit portion, which is adapted to provide load impedance type information.

A method for detecting the impedance of a load in real time is also provided, including:

reading across a sense resistor a voltage that is proportional to the output current of an amplifier delivered on a reactive load;

comparing the output voltage of the amplifier with a threshold voltage;

on the basis of the value of the comparison, generating a logic signal for indicating the low- or high-impedance type of the load; and storing the logic signal at rising and falling fronts of the output voltage of the amplifier in order to detect a low-impedance condition with respectively capacitive or inductive reactive loads.

BRIEF DESCRIPTION OF THE DRAWINGS

Further characteristics and advantages of the invention will become apparent from the description of an embodiment of the device according to the present invention, illustrated only by way of non-limitative example in the accompanying drawings, wherein.

DETAILED DESCRIPTION OF THE INVENTION

Figure 1:
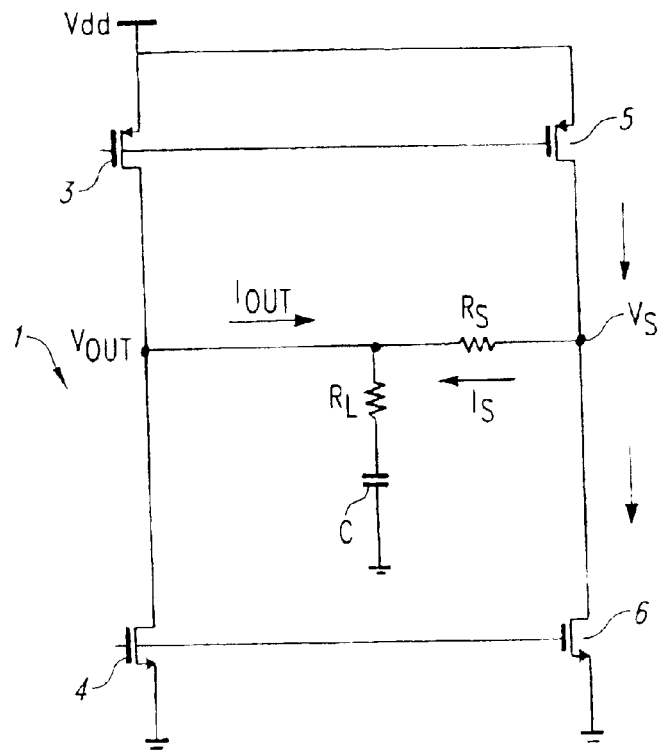
FIG. 1 is a circuit diagram of the analog part of the circuit for detecting load impedance according to the present invention.
Figure 2:
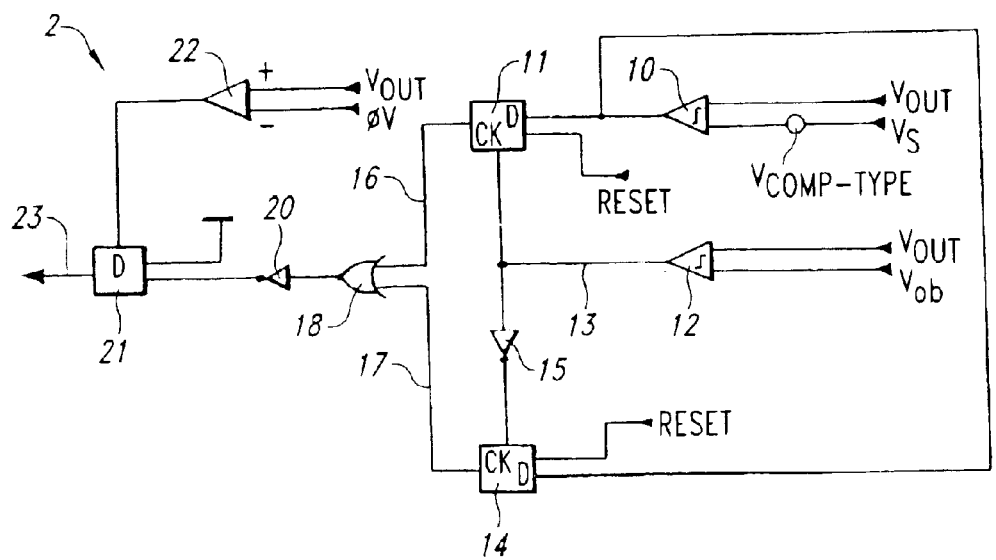
FIG. 2 is a circuit diagram of the digital part of the circuit for detecting load impedance according to the present invention.

With reference to the above figures, the circuit for detecting load impedance according to an embodiment of the present invention comprises an analog portion 1 and a digital portion 2.

In detail, the analog portion of the circuit for detecting load impedance comprises two MOS power transistors 3 and 4, which are mutually series-connected and are interposed between a supply voltage Vdd and the ground, and a second pair of output current sensing transistors 5 and 6, which are arranged mutually in series and are connected, by means of their respective gate terminals, to the gate terminals of the transistors 3 and 4, respectively.

The MOS transistors 4 and 6 are of the N-channel type, while the MOS transistors 3 and 5 are of the P-channel type.

At the intermediate point between the drain terminals of the transistors 3 and 4, the output voltage Vout is tapped and a resistor Rs is interposed between the drain terminals of the transistors 3, 4 and 5, 6.

A second resistor $R_L$, which represents the useful load, is connected to one end of the resistor Rs and to the ground, optionally with a capacitor C interposed.

A current Iout flows in the branch that mutually connects the drain terminals of the two pairs of transistors 3, 4 and 5, 6, while a current is flows through the resistor Rs, is a fraction of Iout and arrives from the MOS transistors 5 and 6, to which the resistor Rs is connected.

The voltage drop across the resistor Rs, designated by Vsense, is applied to the input of load type comparator means 10 which further receive in input the output voltage Vout.

In general, the voltage Vsense is the output voltage of an amplifier (of any kind), before a sense resistor (Rsense), through which a known fraction of the current that passes through a load impedance $R_L$ flows. In this manner, the voltage drop across the sense resistor is proportional to the current that flows in the load.

The voltage Vout is instead the voltage that is present across the load impedance $R_L$.

The load type comparison means 10 provide in output logic information which determines whether the output current is higher than the threshold current; this is done by comparing the difference between the voltage Vsense and the voltage Vout with a reference voltage Vcomp-type.

The signal in output from the comparator means 10 is then sent to a first flip-flop 11 (DATA input), which stores the information sampled at the output of the comparator means 10, while the output voltage is rising and intersects the reference voltage.

Second comparator means 12, adapted to determine an obscure band in which voltage detection is not reliable because the output voltage has an excessively low value, receive in input the output voltage Vout and a so-called obscure band voltage Vob and emit in output a signal 13 which indicates the fact that the output voltage is higher than the reference voltage (this signal is connected to the CLOCK input of the flip-flop 11).

A second flip-flop 14 stores the information sampled at the output of the first comparator means 10 during the opposite front of the output detected by the second comparator means 12.

An inverter 15 is interposed between the second comparator means 12 and the second flip-flop 14.

The signals in output from the first and second flip-flops 11 and 14, designated respectively by 16 and 17, constitute the inputs of a NOR gate 18, whose output passes through a second inverter 20, which is connected to a third flip-flop 21 which receives, at the input DATA, a signal in output from third comparator means 22 which are suitable to determine the intersection of the output voltage with the reference voltage.

Said third comparator means 22 receive in input the output signal Vout and the reference ground.

The signal in output from the third flip-flop 21 corresponds to a signal 23 which indicates the load type, i.e., high- or low-impedance.

With reference now to the above-cited figures, operation of the device according to the present invention is as follows.

Figure 3:
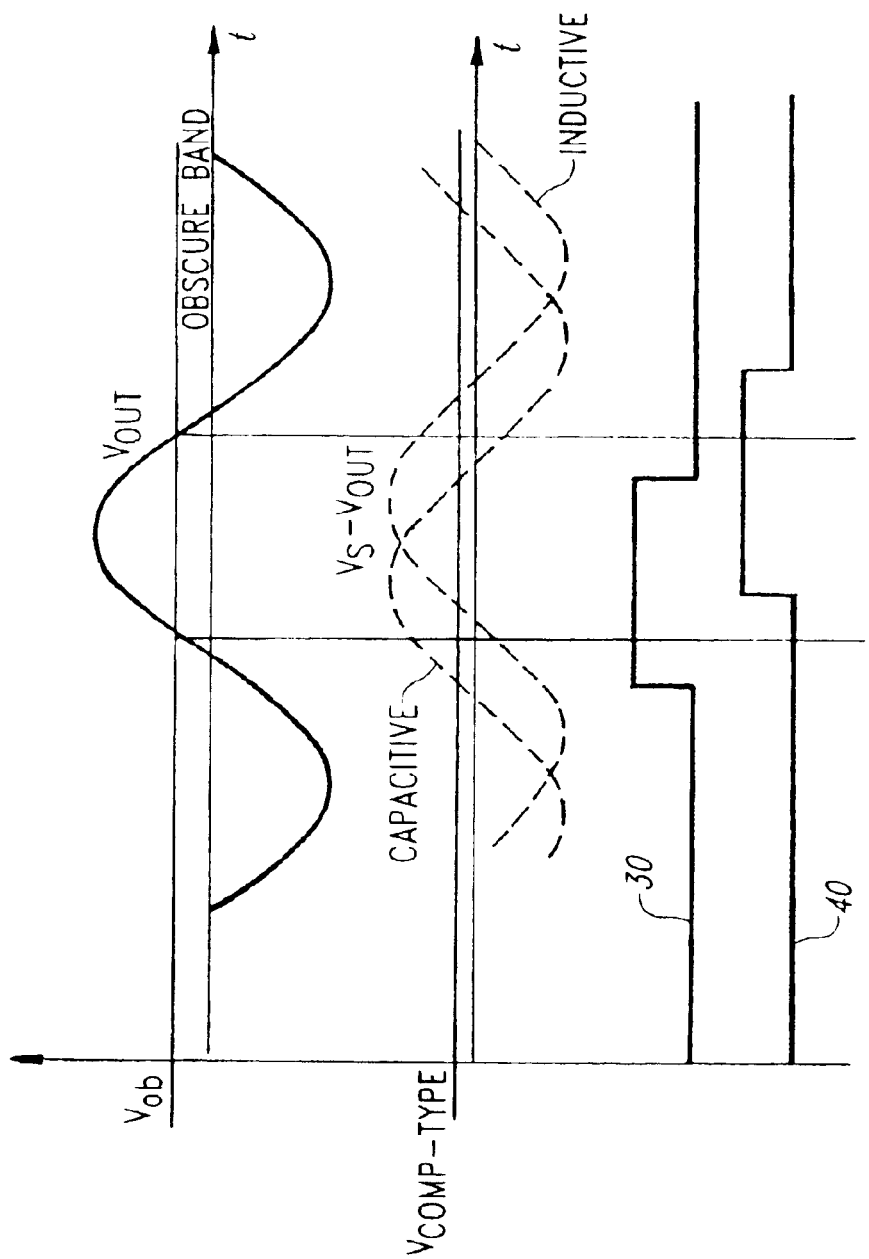
FIG. 3 is a chart which plots the operation of the circuit in the presence of capacitive and inductive low-impedance loads.

Assuming that load detection is performed only during the positive half-wave of the output voltage Vout (if the amplifier is delivering a sinusoidal signal; see also FIG. 3 in this regard), the comparator means 10 emit the high output when the voltage Vsense-Vout exceeds a certain threshold value, which is represented by the voltage Vcomp-type.

Two cases occur:

In the first case, the load impedance is "capacitive," and the current in the load is offset in advance with respect to the voltage Vout. The current in the load is proportional to Vs-Vout.

Therefore, if the load impedance is sufficiently low, the output of the comparator means 10 becomes high before the zero crossing of the voltage Vout (rising), and then returns low always before the zero crossing of the output voltage Vout (falling).

In the second case the load impedance is inductive: in this case, the load current Iload is offset with a delay with respect to the voltage Vout. If the impedance is sufficiently low, the output of the comparator means 10 becomes high after the zero crossing of the output voltage Vout (rising), and then returns low after the zero crossing of the output voltage Vout (falling).

This is shown in FIG. 3, which plots the output voltage Vout, the differences between the voltages Vs and Vout, in the case of a capacitive load and of an inductive load, respectively, and the output signal of the comparator means 10, designated by the reference numeral 30 in the case of a capacitive load and by the reference numeral 40 in the case of an inductive load.

It should also be noted that:

If the load impedance is high, the current Iload, analyzed at the two fronts of the output signal, never exceeds the threshold value, so that the signal emitted by the comparator means 10 remains low. What has been described for the sinusoidal output signal can be extended to the rising and falling fronts of any random signal.

The first comparator means 10 provide logic information which determines that the output current is higher than the threshold current, while the second comparator means 12 determine that the output voltage is higher than the reference voltage. The flip-flop 11 stores the information sampled at the output of the first comparator means 10, while the output voltage is rising and intersects the reference voltage.

Likewise, the second flip-flop 14 stores the information sampled at the output of the first comparator means 10 while the output voltage is decreasing and intersects the reference voltage.

The second comparator means 12 are used to determine whether the output voltage is within a voltage band in which said output voltage Vout would not be reliably detectable.

Load impedance detection can be easily achieved when a purely resistive load is applied, by combining the output voltage of the operational amplifier and the current supplied to the load. In such an ideal case, Ohm's law is applied and the current and the voltage can be sampled during normal operations, with the only precaution of excluding a so-called dead band in which the voltages and the currents are too small to perform reliable load detection.

In practice, when the output signal Vout is near zero, both the voltages and the currents involved are small and therefore the signal supplied by the comparator means 10 is not significant, due to noise and offset. In view of the above it is in fact necessary to have a finite current on the load (to be compared with a threshold) at a finite voltage across said load. The more the circuit approximates the ideal case, the smaller these values can be.

Accordingly, the second comparator means 12 are provided and supply in output the signal 13 in order to sample the output signal of the first comparator means 10 only when it is significant. The comparator means 12 therefore receive in input the output voltage Vout and a voltage Vob which is positive with respect to the zero (if one wishes to detect the load impedance during the positive half-wave of the output signal Vob; this of course changes if impedance is to be detected during the negative half-wave).

Impedance detection actually occurs only if signals with a peak value higher than Vob are applied to the load. Vob is a design parameter, and the more accurate the comparators, the smaller Vob can be.

When it is necessary to detect reactive load impedances applied to the amplifier which is delivering an audio signal, the relation between the current and the voltage is a function of the previous history of the signal.

It has been observed that if the low capacitive impedance is applied, high current is delivered during rising transients of the output voltage, while the application of inductive low-impedance loads causes high current to be delivered during the falling transients of the output voltage.

Accordingly, low-impedance loads are present if high current is delivered during rising or falling fronts of the waveform of the output voltage, or, in other words, high-impedance loads are present if low current is delivered during rising and falling fronts of the waveform of the output voltage.

The logic information on whether the output current is higher or lower than a threshold value, available at the output of first comparator means 10, is sampled and stored in the two flip-flops 11 and 14, while the output waveform intersects a voltage difference value which is detected by the third comparator means 22 during the rising and falling front. The NOR gate 18 connected to the outputs of the two flip-flops 11 and 14 supplies the load impedance information.

The circuit shown in FIG. 1 is used in order to discriminate between high-impedance load and low-impedance load. The voltage across the resistor Rs is:

$$V_s - \tilde{V}_{out} = R_s(Is_p - Is_n)$$

$$V_S - V_{out} = V_{out}\frac{A_6}{A_4}\frac{R_S}{R_L}M_p + I_q\{I_{out}\}\frac{A_6}{A_4}R_s(M_p - M_n)$$

where $\tilde{V}_{out}$ is the output voltage given by the difference between the output voltage Vout and an output voltage Vout in the quiescent state, and Mn,p is the non-ideality factor (ideal value=1) between the power transistors 3 and 4 and the sense transistors 5 and 6.

$$M_{n,p} = \frac{\frac{A_6}{A_4}\text{Real\_Case}}{\frac{A_6}{A_4}\text{Ideal\_Case}}$$

Iq{Iout} is the quiescent current as a function of the output current Iout.

The first load type comparator means 10 are used in order to decide whether the output load impedance is high or low.

The comparator means detect, as mentioned, the voltage drop across the resistor Rs and compare this value with a threshold voltage value.

The threshold value Vcomp_type must be higher than the maximum voltage drop across the resistor Rs when a high-impedance load is applied, i.e., $$V_{compType_{MIN}} > (Vsense - Vout)_{MAX_{active\_load}}$$

In the case of a high-impedance load, the first term of the above equation, which defines the difference between the senses voltage Vsense and the output voltage Vout, can be ignored, and the previously presented equation that defines the threshold value of the voltage can be written as:

$$v_{compType} > I_{q0}\frac{A_6}{A_4}R_s(M_p - M_n)_{Max} + \delta V_{osType}$$

where the influence of the output current on the quiescent current has been ignored, and the worst case of correspondence between the power transistors 3 and 4 and the sense transistors 5 and 6 Mp-Mn and the maximum offset of the first comparator means 10 Vos have been considered.

The information provided by the first comparator means 10 is reliable only if the maximum value of the threshold voltage of the first comparator means 10 is lower than the minimum value of the voltage drop across of the resistor Rs, when a low-impedance load is applied:

$$V_{compType_{MAX}} < (V_{sense} - V_{out})_{MIN_{passive\_load}}$$

The first term of the preceding equation can be obtained by adding the maximum offset of the first comparator means 10 to the second term of the equation that defines the threshold voltage Vcomp-type, thus obtaining the equation $$V_{compType_{MAX}} = I_{q0}\frac{A_6}{A_4}R_s(M_p - M_n)_{Max} + 2\delta V_{osType}$$

while the second term of the above-cited inequality can be obtained from the equation that defines the difference between the voltage Vs and the output voltage Vout, ignoring the dependence of the current Iq with respect to the output current and considering the maximum inequalities:

$$(V_{sense} - V_{out})_{MIN_{passive-load}} = V_{out}\frac{A_6}{A_4}\frac{R_S}{R_L}M_{pMIN} + I_{q0}\frac{A_6}{A_4}R_S(M_p - M_n)_{MIN}$$

By combining the last three equations and solving as a function of the output voltage, and by adding the offset voltage of the second comparator means 12, one obtains the expression for the minimum output voltage at which reliable current sensing can be performed:

$$V_{compObscureBand} = 2I_{q0}\Delta M \frac{R_L}{M_{PMIN}} + \frac{2\delta V_{osType}}{M_{PMIN}\frac{A_6}{A_4}\frac{R_S}{R_L}} + \delta V_{osObscureBand}$$

where the following term has been introduced:

$$\Delta M = (M_{P_{MAX}} - M_{P_{MIN}}) = (M_{N_{MAX}} - M_{N_{MIN}})$$

This term corresponds to the maximum inequalities of the current mirror provided-between the power transistors 3 and 4 and the sense transistors 5 and 6.

In practice it has been observed that the device according to the present invention fully achieves the intended purpose because it enables detection of the impedance of a load during the operation of an amplifier, i.e., in real time, by using digital memory cells and with a reduction in circuit complexity.

The device thus conceived is susceptible of numerous modifications and variations, all of which are within the scope of the inventive concept. Thus, for example, the flip-flop 21 is not necessary for the implementation of the invention. The output of the inverter 20 is in fact already a signal which represents the impedance of the load. The flip-flop 21 is useful in practical implementations in which the high-low impedance signal is used directly in order to change parameters of the audio amplifier (for example the gain). It is noted, in fact, that the high/low impedance signal in output from the inverter 20 changes when the output crosses the threshold value (Vout=Vob different from zero).

Switchings in this instant lead to discontinuity of the output signal Vout and therefore to the addition of unwanted clicking noise. This does not occur if switching occurs exactly when the signal Vout crosses the zero level, avoiding any discontinuity. The input of the flip-flop 21 is connected to the output of the inverter 20 and the data in input to it are sampled on the clock fronts that occur when the signal Vout crosses the zero level (on the other terminal of the comparator means 22).

Moreover, the circuit according to the embodiment of the invention can also perform impedance detection on the negative half-wave of the output signal Vout, or on both half-waves (outside a symmetrical obscure band).

The logic meaning of the output and output signals described in the above description can of course be inverted, i.e., provided in inverted logic.

The analog portion of the circuit according to the invention, shown in FIG. 1, is one of the possible ways to avoid arranging a current sensing resistor Rsense (or Rs) directly in series to the load, in a monolithic integrated circuit. All the details may furthermore be replaced with other technically equivalent elements.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs. The invention is thus to be limited only by the scope of the appended claims and the equivalents thereof.

What is claimed is:

1. A device for detecting load impedance, comprising: an analog circuit portion for detecting the impedance value of a load, and a digital circuit portion, which is suitable to provide load impedance type information, the digital circuit portion comprising a first comparator circuit suitable to determine whether the output current of an audio amplifier is higher or lower than a threshold value and a second comparator circuit suitable to determine whether the output voltage of said amplifier is higher than a reference voltage, and a memory to store the output signals of said first and second comparator circuits, the memory comprising a first fin-flop and a second flip-flop, said first flip-flop connected in output to said first comparator circuit in order to store the output of said first comparator circuit when said output voltage is rising, said second flip-flop connected to the output of said first comparator circuit in order to store the output signal of said first comparator circuit when said output voltage is falling.

2. The device of claim 1, comprising logic means arranged in a cascade configuration with respect to said memory and configured to emit in output a load-type indication signal.

3. The device of claim 2, wherein said logic circuit comprise a NOR gate and an inverter that are cascade-connected.

4. The device of claim 1, wherein said second comparator is configured to determine whether said output voltage is within a preset voltage band, said second comparator connected in output to said first and second flip-flops.

5. The device of claim 4, comprising a third comparator circuit suitable to determine the intersection of said output voltage with the zero value, and a third flip-flop adapted to receive in input the output of said third comparator circuit and of said logic -circuit and configured to emit in output said load type signal.

6. The device of claim 1, wherein said analog circuit portion comprises two power MOS transistors connected in series to each other and between a supply voltage and the ground, and a pair of mirror MOS transistors common-connected with their respective gate terminals to the gate terminals of said power MOS transistors.

7. The device of claim 6, wherein said power MOS transistors comprise a P-channel MOS transistor and an N-channel MOS transistor.

8. The device of claim 6, wherein said mirror MOS transistors comprise a P-channel MOS transistor and an N-channel MOS transistor.

9. The device of claim 6, comprising a sense resistor interposed between the drain terminals of said power MOS transistors and of said mirror MOS transistors.

10. The device of claim 9, comprising an additional resistor connected between a circuit branch for connecting the drain terminals of said power MOS transistors and said mirror MOS transistors and the ground.

11. A method for detecting the impedance of a load in real time, comprising:

reading across a sense resistor a voltage that is proportional to the output current of an amplifier, which is delivered on a reactive load;

comparing the output voltage of said amplifier with a threshold voltage;

on the basis of the value of said comparison, generating a logic signal which indicates the low- or high-impedance type of the load, wherein the threshold value of said output voltage is higher than the maximum voltage drop across a sense resistor when a high-impedance load is applied; and storing said logic signal at rising and falling fronts of said output voltage of the amplifier; in order to detect a low-impedance condition with respectively capacitive or inductive reactive loads.

12. The method of claim 11, further comprising comparing said output voltage with a minimum threshold voltage, said minimum threshold voltage determining the lower value of the output voltage useful to assuredly detect the impedance value of said load.

13. The method of claim 11, further comprising detecting the zero crossing of said output voltage.

14. The method of claim 11, wherein reading said voltage drop across said sense resistor is performed by an analog circuit portion.

15. A load impedance detecting device, comprising:

an analog load impedance detecting circuit having a sense voltage output representing the voltage across a sense resistor and a load voltage output representing a load voltage; and a digital load impedance determining circuit coupled to the analog load impedance detecting circuit and configured to receive the sense voltage output and the load voltage output and compare the difference between the sense voltage output and the load voltage output to a first reference voltage and to determine whether the impedance is high or low, and to compare the low voltage output to a second reference voltage to determine the reliability of the load voltage output, the digital load impedance determining circuit further configured to output the comparison of the sense voltage output and the load voltage output when the comparison of the load voltage output to a second reference voltage meets a predetermined threshold value.

16. The device of claim 15 wherein the digital load impedance determining circuit is further configured to compare the load voltage output to a ground reference signal and to output the comparison of the sense voltage output and the load voltage output when the value of the load voltage output crosses the value of the ground reference signal.

17. The device of claim 15, wherein the digital load impedance determining circuit is further configured to store an output of the comparison of the sense voltage output and the load voltage output until the value of the load voltage output crosses the value of the ground reference signal, at which time the output of the comparison of the sense voltage output and the load voltage output is output from the digital load impedance determining circuit.

* * * * *

UNITED STATES PATENT AND TRADEMARK OFFICE
CERTIFICATE OF CORRECTION

PATENT NO.    : 6,812,715 B2
DATED         : November 2, 2005
INVENTOR(S)   : Chiokzzi et al.

It is certified that error appears in the above-identified patent and that said Letters Patent is hereby corrected as shown below:

<u>Column 7,</u>
Lines 49 and 50, "first fin-flop and a second flip-flop" should read as -- first flip-flop and second flip-flop" --
Lines 64 and 66, "comparator" should read as -- comparator circuit --.

Signed and Sealed this

Twenty-eighth Day of June, 2005

JON W. DUDAS
*Director of the United States Patent and Trademark Office*